(12) United States Patent
Pauly

(10) Patent No.: US 10,411,813 B2
(45) Date of Patent: Sep. 10, 2019

(54) APPARATUS AND METHOD FOR TESTING BEAMFORMING BEHAVIOR

(71) Applicant: Rohde & Schwarz GmbH & Co. KG, Munich (DE)

(72) Inventor: Andreas Pauly, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 227 days.

(21) Appl. No.: 15/363,521

(22) Filed: Nov. 29, 2016

(65) Prior Publication Data

US 2017/0222734 A1    Aug. 3, 2017

(30) Foreign Application Priority Data

Jan. 29, 2016  (EP) ..................................... 16153360
Jul. 15, 2016  (EP) ..................................... 16179629

(51) Int. Cl.
| | | |
|---|---|---|
| *H01Q 3/04* | (2006.01) |
| *H04B 17/10* | (2015.01) |
| *H01Q 3/26* | (2006.01) |
| *H01Q 9/28* | (2006.01) |
| *H01Q 21/24* | (2006.01) |
| *G01R 29/08* | (2006.01) |
| *G01R 29/10* | (2006.01) |
| *H01Q 13/08* | (2006.01) |
| *H01Q 17/00* | (2006.01) |
| *H04B 17/15* | (2015.01) |
| *H04B 17/29* | (2015.01) |
| *H04B 17/00* | (2015.01) |
| *G01R 31/28* | (2006.01) |

(52) U.S. Cl.
CPC ....... *H04B 17/103* (2015.01); *G01R 29/0878* (2013.01); *G01R 29/10* (2013.01); *H01Q 3/04* (2013.01); *H01Q 3/267* (2013.01); *H01Q 9/285* (2013.01); *H01Q 13/085* (2013.01); *H01Q 17/00* (2013.01); *H01Q 21/24* (2013.01); *H04B 17/101* (2015.01); *H04B 17/15* (2015.01); *H04B 17/29* (2015.01); *G01R 31/2822* (2013.01); *H04B 17/0085* (2013.01); *H04B 17/102* (2015.01)

(58) Field of Classification Search
CPC ...................................................... H01Q 3/267
See application file for complete search history.

(56) References Cited

U.S. PATENT DOCUMENTS

| | | | |
|---|---|---|---|
| 2011/0125429 A1 | 5/2011 | Kazama et al. | |
| 2014/0300519 A1* | 10/2014 | Estebe | H01Q 3/267 343/703 |
| 2015/0035707 A1 | 2/2015 | Tankielun | |

FOREIGN PATENT DOCUMENTS

| | | |
|---|---|---|
| FR | 2976146 A1 | 12/2012 |
| JP | 2009115644 A | 5/2009 |

(Continued)

*Primary Examiner* — Graham P Smith
(74) *Attorney, Agent, or Firm* — Ditthavong & Steiner, P.C.

(57) ABSTRACT

An apparatus for testing the beamforming behavior of a device under test comprises: at least two over-the-air power sensors. Each over-the-air sensor is adapted to measure the power received from the device under test over the air, which leads to at least two respective measurement results. The apparatus also comprises an evaluation unit, which is connected to each of the at least two over-the-air power sensors, and is adapted to receive and to evaluate the at least two respective measurement results.

14 Claims, 5 Drawing Sheets

(56) References Cited

FOREIGN PATENT DOCUMENTS

WO 2014086268 A1 6/2014
WO 2014105787 A1 7/2014

* cited by examiner

APPARATUS AND METHOD FOR TESTING BEAMFORMING BEHAVIOR

PRIORITY

This application claims priority of European patent applications EP 16 179 629.7 filed on Jul. 15, 2016 and EP 16 153 360.9 filed on Jan. 29, 2016 which are incorporated by reference herewith.

FIELD OF THE INVENTION

The invention relates to an apparatus and a method for testing a device under test with respect to wireless communication, especially with respect to the beamforming behavior of the device under test.

BACKGROUND OF THE INVENTION

Generally, in times of an increasing number of wireless communication applications employing MIMO (Multiple Input Multiple Output) systems such as LTE (Long Term Evolution), there is a growing need of an apparatus and a method for testing devices under test applying such systems with special respect to their beamforming behavior due to the importance of this characteristic in view of quality aspects.

WO 2014/086268 A1 shows a device and a method for testing a performance of a wireless terminal employing MIMO. However, said document does not disclose how the beamforming behavior of the wireless terminal, respectively the MIMO device under test, can be tested. It also allows only static measurement.

Accordingly, it is an object to provide a testing device and a testing method for testing devices under test having multiple outputs, respectively multiple inputs, and especially for investigating the beamforming behavior of the devices under test.

This is solved by the features of claim 1 for a testing apparatus and claim 13 for the method. The dependent claims contain further developments.

SUMMARY OF THE INVENTION

According to a first aspect of the invention, an apparatus for testing the beamforming behavior of a device under test is provided. The apparatus comprises at least two over-the-air power sensors, each of which is adapted to measure the power received from the device under test over the air simultaneously, which leads to at least two respective measurement results. In addition to this, the apparatus comprises an evaluation unit, which is connected to each of the at least two over-the-air power sensors and is adapted to receive and to evaluate the at least two respective measurement results.

According to a preferred implementation form of the first aspect, each of the at least two over-the-air power sensors comprises at least one Vivaldi antenna.

According to a further preferred implementation form of the first aspect, each of the at least two over-the-air power sensors measures the received power over time and/or in a time maximally deviating 5%, preferably 2%, most preferably 1% from real time.

According to a further preferred implementation of the first aspect, the over-the-air power sensors form a planar array, wherein the over-the-air power sensors are regularly spaced according to a specific pattern, or the at least two over-the-air sensors form any two-dimensional array, or a parabolic array or a spherical array or any three-dimensional array.

According to a further preferred development of the previous implementation form of the first aspect, antennas, especially Vivaldi antennas of the at least two over-the-air power sensors are arranged in parallel or are directed with respect to a focal point of the parabolic or a center of the spherical array.

According to a further preferred implementation form of the first aspect, each antenna of the at least two over-the-air power sensors has the same direction of polarization, or wherein with respect to each of the at least two over-the-air power sensors, the direction of polarization of the antennas varies according to a chessboard pattern or another predefined pattern.

According to a further preferred implementation form of the first aspect, the at least two over-the-air power sensors form a first array with antennas of the sensors having a first direction of polarization and a second array with antennas of the sensors having a second direction of polarization.

According to a further preferred implementation form of the first aspect, each or at least one of the at least two over-the-air power sensors is mechanically moveable.

According to a further preferred implementation form of the first aspect, within a first area directed to the main lobe of the device under test, the density of the over-the-air power sensors is higher than within other areas.

According to a further preferred implementation form of the first aspect, the evaluation unit evaluates the at least two respective measurement results in synchronism and/or phase-coherently with respect to each other.

According to a further preferred implementation form of the first aspect, evaluating the at least two respective measurement results by the evaluation unit results in a dynamically measured radiation process of the device under test.

According to a further preferred implementation form of the first aspect, the apparatus further comprises a display unit, connected to the evaluation unit, adapted to display a visualization of the evaluation of the at least two respective measurement results in form of a color-coded or grey-coded representation, wherein a certain measured power corresponds to a predefined color or a predefined grey tone.

According to a second aspect of the invention, a method for testing the beamforming behavior of a device under test is provided. The method comprises the steps of measuring the power received from the device under test over the air by at least two over-the-air power sensors at at least two different points simultaneously, which leads to at least two respective measurement results, and evaluating the at least two respective measurement results.

According to a preferred implementation form of the second aspect, at each of the at least two different points, the received power is measured over time and/or in a time maximally deviating 5%, preferably 2%, most preferably 1% from real time.

According to a further preferred implementation form of the second aspect, the at least two different points form a planar array, wherein the at least two different points are regularly spaced according to a specific pattern, or the at least two different points form any two-dimensional array, or a parabolic array or a spherical array or any three-dimensional array.

BRIEF DESCRIPTION OF THE DRAWINGS

Exemplary embodiments of the invention are now further explained with respect to the drawings by way of example only, and not for limitation. In the drawings.

Firstly, before embodiments of the inventive apparatus and the inventive method will be illustrated with the aid of FIG. 5, FIG. 6, FIG. 7, FIG. 8 and FIG. 9, some embodiments of the over-the-air power sensor, which is employed by the invention, are shown. For this purpose, the general construction and function of an over-the-air power sensor is demonstrated along FIG. 1 and FIG. 2. Along FIG. 3 and FIG. 4, further details of another implementation form of an over-the-air power sensor are described. Similar entities and reference numbers in different figures have been partially omitted.

In general, the over-the-air power sensor, which is adapted to measure the power received from a device under test over the air, comprises an antenna, preferably a Vivaldi antenna, which is adapted to receive a first measuring signal from a device under test. Moreover, it comprises an analog signal processor which is directly connected to the antenna and is adapted to reduce a frequency of the received first measuring signal, resulting in a frequency reduced first measuring signal and thereby in a respective measurement result also containing the power received from the device under test over the air. Furthermore, the over-the-air power sensor comprises a connector, connected to said analog signal processor, which is adapted to output the first frequency reduced measuring signal. It is thereby possible to acquire a measuring signal of an extremely high frequency without altering it and to provide a lower frequency measuring signal to further measuring devices.

Figure 1:
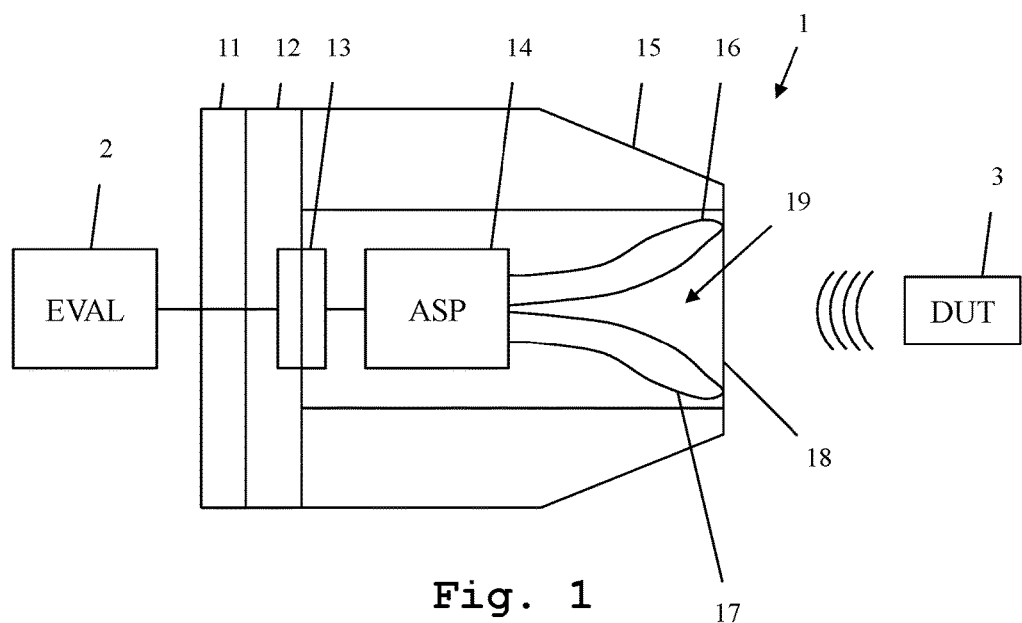
FIG. 1 shows a first embodiment of a over-the-air power sensor employed by the invention in a top-down view.

In FIG. 1, a first embodiment of an over-the-air power sensor 1 employed by the invention is shown. The over-the-air power sensor 1 comprises a housing 15 which contains a substrate 18, advantageously a printed circuit board. On the substrate 18, two antenna elements 16, 17 forming a tapered slot line antenna 19, are arranged. The antenna 19 is connected to an analog signal processor 14 which is also arranged on the substrate 18. The analog signal processor moreover is connected to a connector 13 which serves as an interface 13. Connectable to the interface 13 is an evaluation unit 2, which is inventively not part of the over-the-air power sensor 1. The antenna 19 has a main radiation direction towards the right edge of the substrate 18, indicated by an arrow in the figures. A device under test 3 is suitably arranged in this direction.

In order to minimize reflections from the over-the-air power sensor 1, the housing 15 is tapered towards the main radiation direction of the antenna 19. This tapering reduces the effective surface area, which can produce reflections. In order to further reduce such reflections, the housing 15 can be fabricated from an electromagnetic radiation absorbing material. It can also be covered with such a material or can be coated with an absorptive paint. The housing 15 furthermore comprises a back plate 11, which is covered with absorptive material 12 in order to further reduce reflections.

Furthermore, a first measuring signal emitted from the device under test 3 is received by the antenna 19 and handed to the analog signal processor 14. The analog signal processor 14 reduces the frequency of the first measuring signal resulting in a frequency reduced first measuring signal. This is for example done by down-converting the first measuring signal using a mixer. Additionally, the analog signal processor in this case can comprise one or more filters for filtering the first measuring signal or the frequency reduced first measuring signal, power determining means, which can be used for directly measuring a power of the frequency reduced first measuring signal, an amplifier for amplifying the first measuring signal or the first frequency reduced measuring signal, and a radio frequency switch for switching between the previously described measuring option and the measuring option described in the following. The processed frequency reduced measuring signal is then handed on to the connector 13, which passes on the signal to for example an evaluation unit 2 for further evaluating the frequency reduced measuring signal, respectively the respective measurement result also containing the power received from the device under test over the air.

Figure 2:
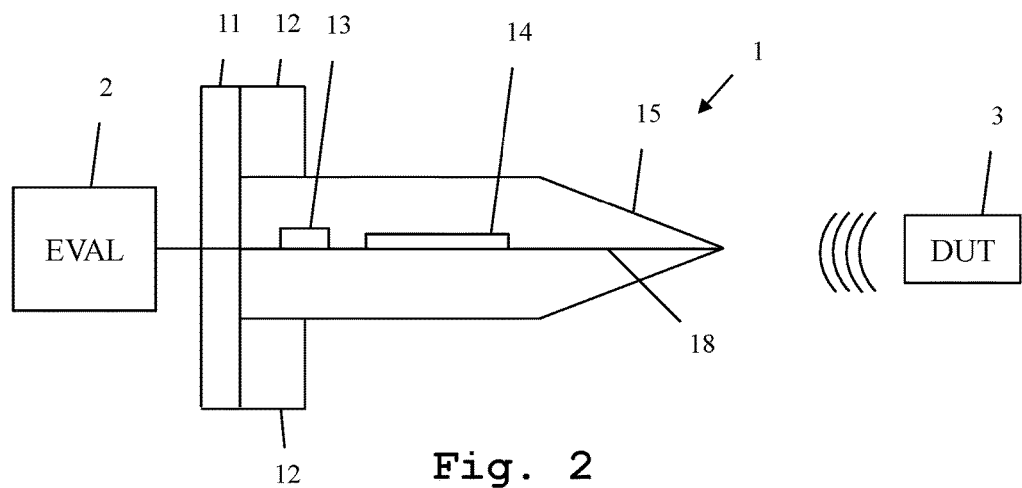
FIG. 2 shows the first embodiment of the over-the-air power sensor employed by the invention in a side-view.

In FIG. 2, the over-the-air power sensor of FIG. 1 is shown in a cut view from the side. Here, it can be seen that the analog signal processor 14 and the connector 13 are arranged on the substrate 18. Moreover, the tapering of the housing 15 and the arrangement of the absorbers 12 can be seen.

Figure 3:
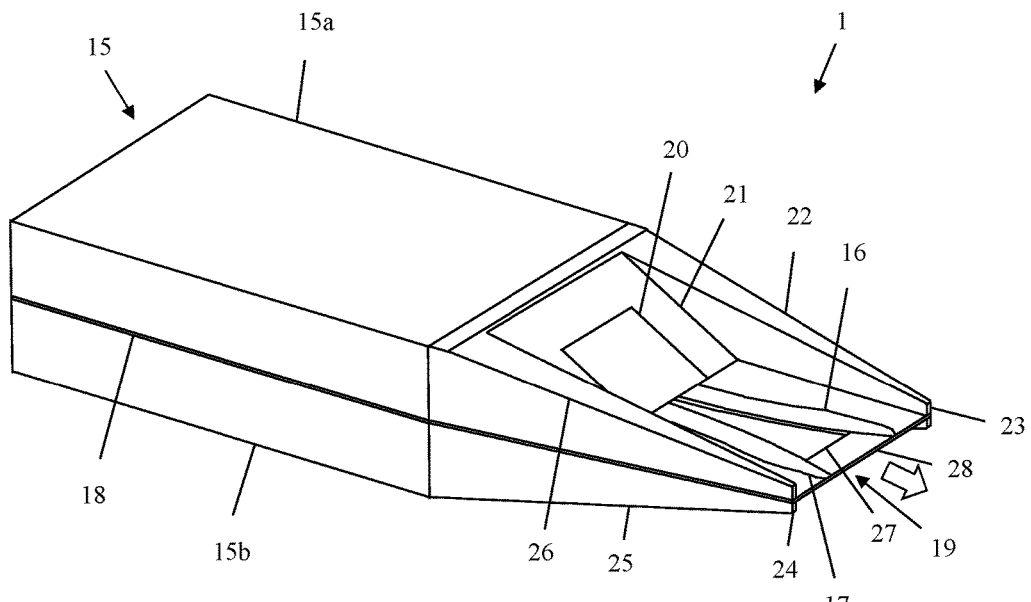
FIG. 3 shows a second embodiment of the over-the-air power sensor employed by the invention in a three-dimensional view.

In FIG. 3, a second embodiment of the over-the-air power sensor 1 is shown. Here, a three-dimensional view of the over-the-air power sensor 1 is depicted. The housing 15 comprises a first part 15a and a second part 15b. The two housing parts surround the substrate 18 and hold the substrate 18 between themselves. The substrate 18 comprises an opening 27 between the antenna elements 16 and 17. This opening 27 further reduces the influence of the substrate material on the received signal. For reasons of stability, the embodiment shown here comprises a substrate bridge 28 connecting opposite parts of the tapered slot line antenna in the area of the antenna aperture.

Moreover, the over-the-air power sensor 1 comprises an absorber 20, which is arranged surrounding the substrate 18 at the narrow end of the tapered slot line antenna 19. The absorber 20 prevents reflections towards the device under test 2.

Moreover, in this embodiment, the geometric shape of the over-the-air power sensor 1 is evident. Especially, it is evident here, that the over-the-air power sensor 1 is tapered towards the main radiation direction of the antenna 19. Moreover, it is evident that all surfaces of the over-the-air power sensor 1 facing the main radiation direction of the antenna 19 are angled away from a normal of the main radiation direction of the antenna 19. This leads to an especially low reflectivity for signals emitted by the device under test 2. Here, only the very small surfaces 23, 24 point towards the device under test. All other surfaces 21, 22, 25, 26 are angled away from the device under test 2.

Especially, at least 50%, preferably at least 80%, most preferably all surfaces of the over-the-air power sensor 1 facing the main radiation direction of the antenna are therefore angled away from a normal of the main radiation direction of the antenna by at least 30°, preferably by at least 45°, most preferably by at least 60°.

In order to further reduce the effect of the substrate 18 on the received signal, the relative permittivity $\varepsilon_r$ is low. Especially, it is lower than 4, preferably $\varepsilon_r<2$, most preferably $\varepsilon_r<1.5$. For the same reason, the relative permeability $\mu_r$ is low. Advantageously it is below 3, preferably $\mu_r<2$, most preferably $\mu_r<1.5$.

Figure 4:
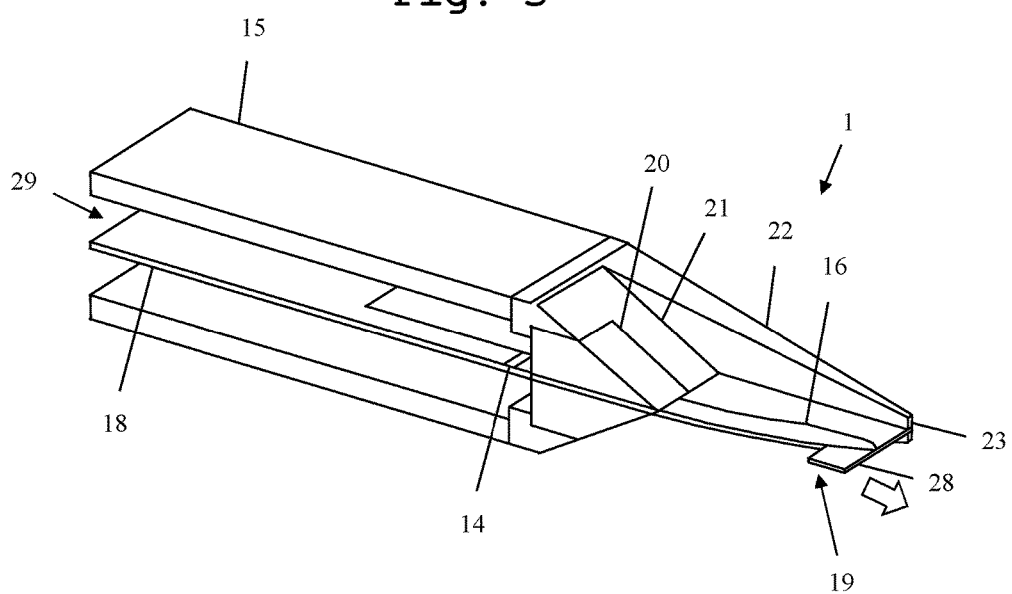
FIG. 4 shows the second embodiment of the over-the-air power sensor employed by the invention in a cut-view.

In FIG. 4, a cut open view of the embodiment of FIG. 3 is shown. Here, it is evident that the housing 15 comprises an opening 29, which encloses the substrate 18. Arranged on the substrate 18 is the analog signal processor 14, which is connected to the antenna element 16, 17 of the antenna 19. As explained earlier, the analog signal processor 14 processes signals received by the antenna 19. Especially the analog signal processor 14 performs a frequency conversion.

Evident from FIG. 4 is that the absorber 20 surrounds the substrate 18 on both sides in order to reduce the reflections towards the device under test.

Instead of forming the antenna 19 as depicted here, it is also possible to use two tapered slot line antennas on substrates, which are arranged orthogonally. In this case, a dual linear polarization measurement can be provided. The signals of these two antennas can be handled separately or can be combined.

Also advantageously, power determining means can be integrated into the analog signal processor 14. A power measurement of signals received from the device under test can then directly be performed there. The power measurement in this case would be performed under a frequency reduced first measuring signal, which leads to a respective measurement result containing the power received from the device under test over the air. In this case, a load resistor of the power determining means of the antenna has a higher value than 50 Ohm.

As power determining means, a diode sensor produced in slot line technology can be used.

In addition, a rectification and/or a bandwidth limitation and/or an analog-digital-conversion can also be integrated into the analog signal processor. The analog signal processor 14 can moreover be adapted to provide an intermediate frequency signal or a baseband signal to the connector 13.

Advantageously, the antenna signals, especially if the antenna is a slot line antenna, can be converted to a signal on a coplanar transmission line so that they can be more easily handled on the circuit board and supplied to the further components.

The change of the transmission typology from slot line to coplanar can be performed either between the antenna and the analog signal processor or between the analog signal processor and the connector.

Figure 5:
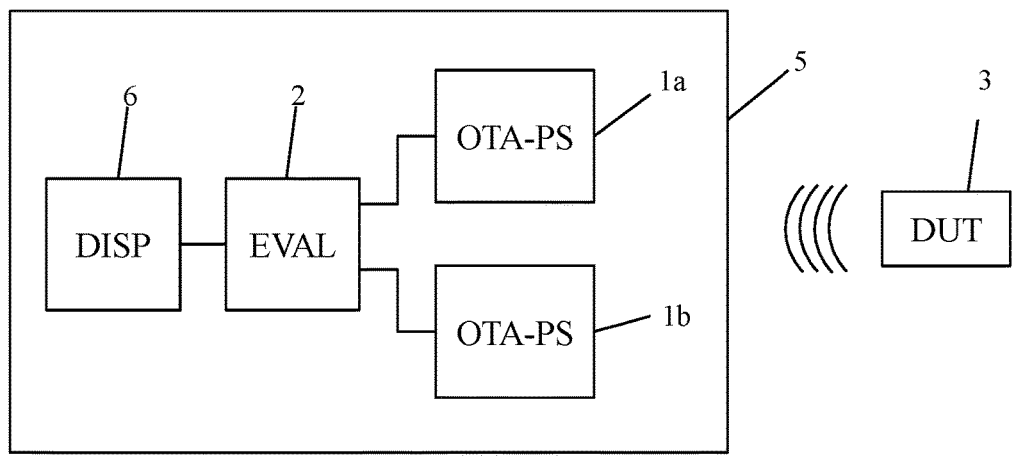
FIG. 5 shows an exemplary embodiment of the inventive apparatus for testing the beamforming behavior of a device under test.

Now, with respect to FIG. 5, an exemplary embodiment of the inventive apparatus 5 for testing the beamforming behavior of a device under test 3 is shown.

The inventive apparatus 5 comprises two over-the-air power sensors 1a, 1b according to the foregoing explanations and an evaluation unit 2, wherein each of the two over-the-air power sensors 1a, 1b is connected to the evaluation unit 2.

In this context, it is to be pointed out that the following statements also apply to embodiments of the inventive apparatus 5 employing more than two over-the-air power sensors 1a, 1b. In a preferred test setup many over-the-air-power sensors, such 10 or 100 or even 1000 sensors are used.

After a signal has been sent by the device under test 3 over the air, each of the over-the-air power sensors 1a, 1b measures the power received from the device under test 3, which leads to two respective measurement results. Then, the two respective measurement results are passed to the evaluation unit 2 and are evaluated by the latter.

Furthermore, each of the two over-the-air power sensor 1a, 1b measures the received power preferably in a time maximally deviating 5%, preferably 2%, most preferably 1% from real time. Furthermore, the evaluation unit 2 may advantageously evaluate the two respective measurement results in synchronism. Alternatively or additionally, the evaluation unit 2 may evaluate the two respective measurement results phase-coherently with respect to each other. Consequently, with knowledge of the respective phase information, respectively with knowledge of the respective delay difference, a further spatial allocation may advantageously be carried out with the aid of the evaluation unit 2.

In addition to this, each of the two over-the-air power sensors 1a, 1b may preferably measure the received power over time and thus, evaluating the two respective measurement results by the evaluation unit 2 advantageously results in a dynamically measured radiation process of the device under test 3. If many, for example 10 or even 100 or even 1000 sensors are used, an accurate partial resolution of the beam emitted by the device under test 3 is possible.

Figure 6:
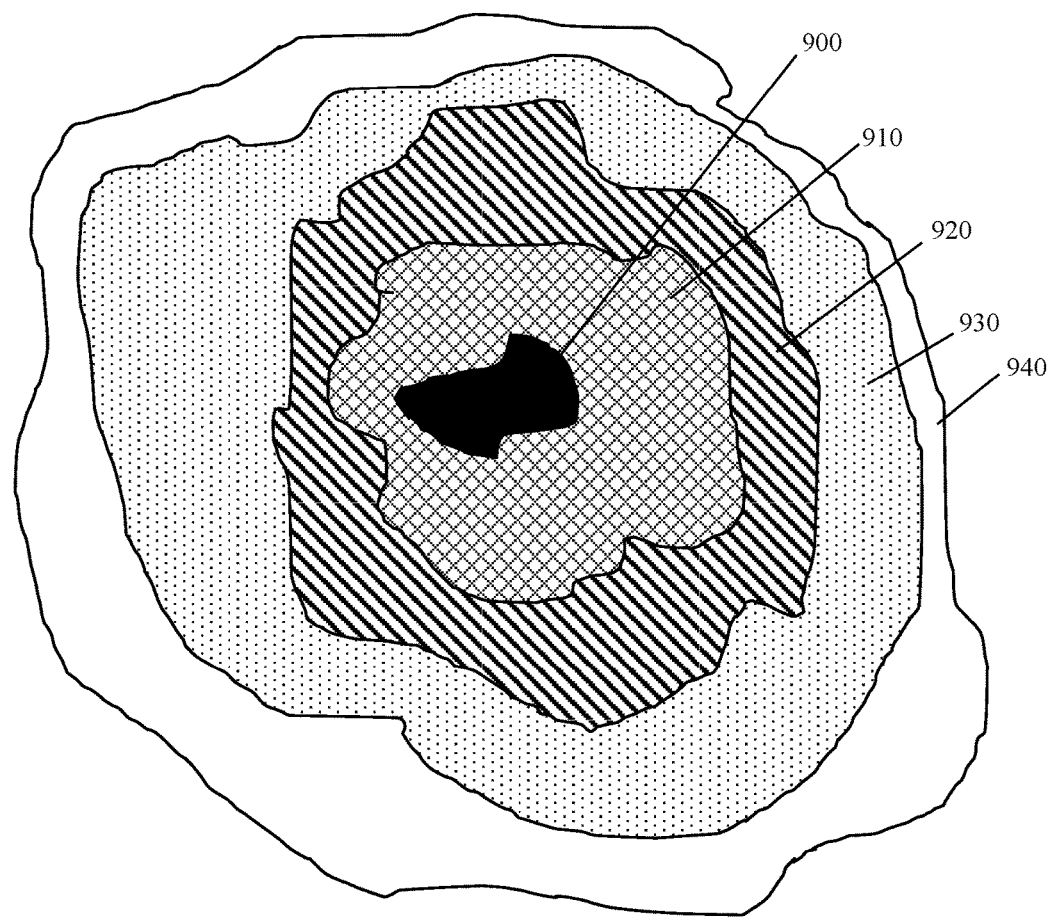
FIG. 6 shows a color-coded of grey coded representation of the measurement results.

Further advantageously, in order to visualize the dynamically measured radiation process of the device under test 3, the inventive apparatus 5 may additionally comprise a display unit 6 being connected to the evaluation unit 2 for displaying a visualization of the evaluation of the respective measurement results. This visualization may preferably be done in form of a color-coded or grey-coded representation, wherein a certain measured power corresponds to a predefined color or a predefined grey tone as shown in FIG. 6.

For instance, in the case of a color-coded representation, the color red may correspond to an area 900 of high measured power or of a high irradiation intensity, whereas the color blue may correspond to an area 940 of low measured power or of a low irradiation intensity. Each areas 910, 920 and 930 of the measured powers between said high and low measured power or each of the irradiation intensities between said high and low irradiation intensity, correspond to a color between red and blue, for example orange, yellow or green.

For instance, in case grey-coded representation, black may correspond to an area 900 of high measured power or of a high irradiation intensity, whereas the color white may correspond to an area 940 of low measured power or of a low irradiation intensity. Each areas 910, 920 and 930 of the measured powers between said high and low measured power or each of the irradiation intensities between said high and low irradiation intensity, correspond to a grey shade between black and white.

Additionally, it should be mentioned that in the case of the above-mentioned dynamically measured radiation process of the device under test 3, the color-coded or grey-coded representation may advantageously be a full-video representation. This allows to follow the development of the power distribution over time.

Moreover, especially in the not shown case of a plurality of over-the-air power sensors employed by the inventive apparatus 5, the over-the-air power sensors 1a, 1b, respectively the antennas of the sensors 1a, 1b advantageously form a planar array, wherein the sensors 1a, 1b, respectively their antennas, are regularly spaced according to a specific pattern, or the sensors 1a, 1b, respectively their antennas, form any two-dimensional array, or a parabolic array or spherical array or any three-dimensional array. Additionally and as already mentioned above, the antennas of the sensors 1a, 1b are preferably Vivaldi antennas.

Further advantageously, the antennas, respectively the Vivaldi antennas, of the over-the-air power sensors 1a, 1b are arranged in parallel. Alternatively, said antennas are directed with respect to a focal point of the above-mentioned parabolic array or to a center of the likewise above-mentioned spherical array.

In addition to all this, it is generally advantageous, on the one hand, if all several or at least one of the over-the-air power sensors 1a, 1b, respectively their antennas, are mechanically moveable, and on the other hand, if the density of the over-the-air power sensors, especially in the not shown case of a plurality of over-the-air power sensors employed by the inventive apparatus 5, is higher within an area directed to the main lobe of the device under test 3 than outside this area.

It is further generally advantageous, if each antenna, respectively each Vivaldi antenna, of the over-the-air power sensors has the same direction of polarization. Alternatively, the direction of polarization of said antennas varies according to a chessboard pattern or another predefined pattern. This allows to also measure the distribution of polarization of the radiation emitted by the device under test.

Figure 7:
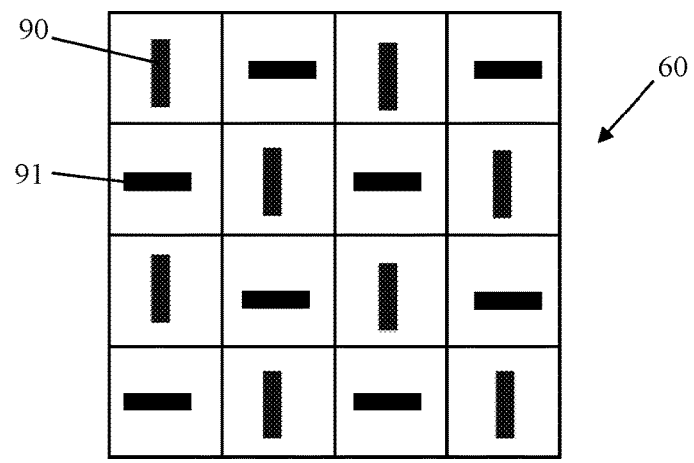
FIG. 7 shows an exemplary array of the antennas of the over-the-air power sensors, wherein the direction of polarization of the antennas varies according to a chessboard pattern.

Now, with respect to the foregoing second alternative, especially regarding the chessboard pattern, an exemplary antenna array 60 is illustrated by FIG. 7. Whereas a vertical bar 90 represents a first direction of polarization, respectively a vertical polarization, a horizontal bar 91 represents a second direction of polarization, respectively a horizontal polarization. One can see that in accordance with FIG. 7, the direction of polarization (vertical, horizontal) of the antennas of the over-the-air power sensors varies according to a chessboard pattern.

Figure 8:
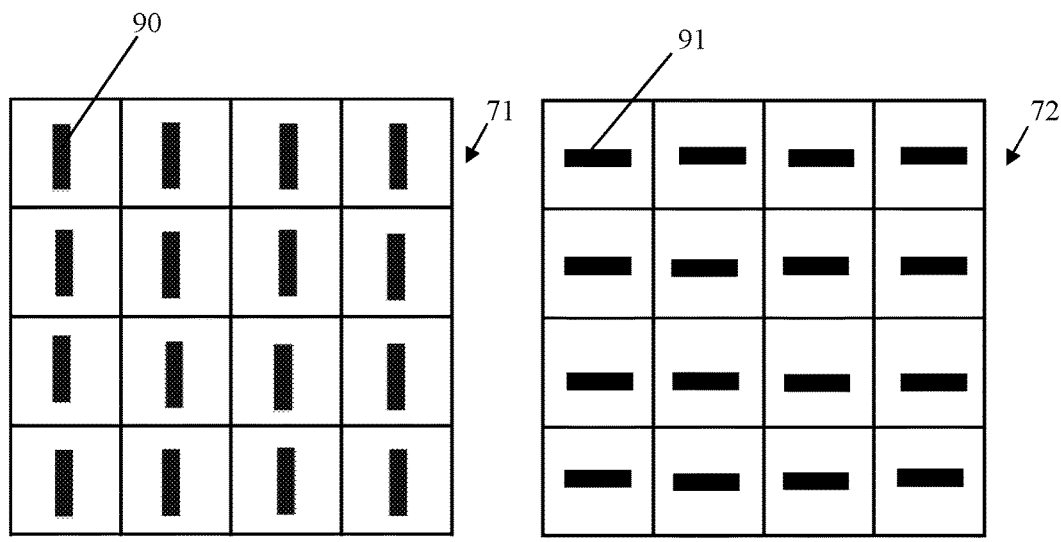
FIG. 8 shows an exemplary first array and an exemplary second array each formed by the antennas of the over-the-air power sensors, wherein the antennas of the first array have a first direction of polarization and the antennas of the second array have a second direction of polarization.

Now, with respect to FIG. 8, it is also generally advantageous, if the antennas, respectively the Vivaldi antennas, of the over-the-air power sensors form a first antenna array 71 having a first direction of polarization, respectively a vertical polarization, and a second antenna array 72 having a second direction of polarization, respectively a horizontal polarization. In this case a first measurement is done in front of the first array 71 and a second measurement is done in front of the second array 72.

Figure 9:
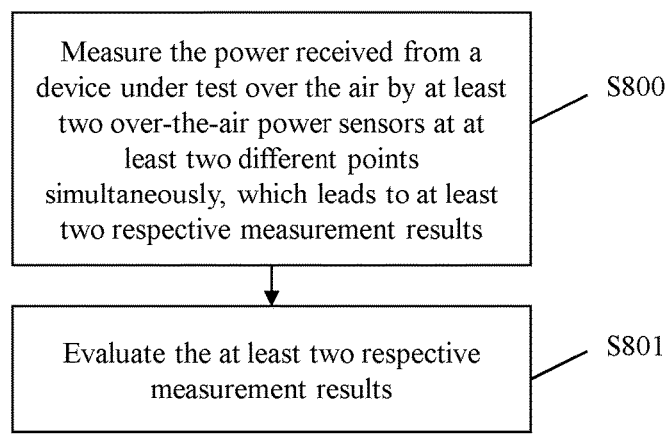
FIG. 9 shows a flow chart of an embodiment of the second aspect of the invention.

Finally, FIG. 9 shows a flow chart of the inventive method. In a first step S800, the power received from a device under test over the air is measured by at least two over-the-air power sensors at at least two different points simultaneously, which leads to at least two respective measurement results. Then, in a second step S801, the at least two respective measurement results are evaluated.

The invention is not limited to the examples. The characteristics of the exemplary embodiments can be used and can be combined in any advantageous combination. All features shown in drawings, described in the description and/or claimed in the claims can be combined.

While various embodiments of the present invention have been described above, it should be understood that they have been presented by way of example only, and not limitation.

Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An apparatus for testing the beamforming behavior of a device under test, the apparatus comprising:
   at least two over-the-air power sensors, each adapted to measure the power received from the device under test over the air simultaneously, which leads to at least two respective measurement results, wherein each of the at least two over-the-air power sensors measures the received power over time and in a time maximally deviating 5% from real time, and
   an evaluation unit, connected to each of the at least two over-the-air power sensors, adapted to receive and to evaluate the at least two respective measurement results,
   wherein the evaluation unit evaluates the at least two respective measurement results in synchronism or phase-coherently with respect to each other.

2. The apparatus according to claim 1,
   wherein each of the at least two over-the-air power sensors comprises at least one Vivaldi antenna.

3. The apparatus according to claim 1,
   wherein each of the at least two over-the-air power sensors measures the received power in a time maximally deviating 1% or 2% from real time.

4. The apparatus according to claim 1,
   wherein the over-the-air power sensors form a planar array, wherein the over-the-air power sensors are regularly spaced according to a specific pattern, or the at least two over-the-air sensors form any two-dimensional array, or a parabolic array or a spherical array or any three-dimensional array.

5. The apparatus according to claim 4,
   wherein antennas, especially Vivaldi antennas, of the at least two over-the-air power sensors are arranged in parallel or directed with respect to a focal point of the parabolic array or a center of the spherical array.

6. The apparatus according to claim 1,
   wherein each antenna of the at least two over-the-air power sensors has the same direction of polarization, or wherein with respect to each of the at least two over-the-air power sensors the direction of polarization of the antennas varies according to a chessboard pattern or another predefined pattern.

7. The apparatus according to claim 1,
   wherein the at least two over-the-air power sensors form a first array with antennas of the sensors having a first direction of polarization and a second array with antennas of the sensors having a second direction of polarization.

8. The apparatus according to claim 1,
wherein at least one over-the-air power sensor is mechanically moveable.

9. The apparatus according to claim 1,
wherein within a first area directed to the main lobe of the device under test, the density of the over-the-air power sensors is higher than within other areas.

10. The apparatus according to claim 1,
wherein evaluating the at least two respective measurement results by the evaluation unit results in a dynamically measured radiation process of the device under test.

11. The apparatus according to claim 1,
wherein the apparatus further comprises a display unit, connected to the evaluation unit, adapted to display a visualization of the evaluation of the at least two respective measurement results in form of a color-coded or grey-coded representation, wherein a certain measured power corresponds to a predefined color or a predefined grey tone.

12. A method for testing the beamforming behavior of a device under test, the method comprising the steps of:
measuring the power received from the device under test over the air by at least two over-the-air power sensors at at least two different points simultaneously, which leads to at least two respective measurement results,
measuring at each of the at least two different points, the received power over time and in a time maximally deviating 5% from real time, and
evaluating the at least two respective measurement results,
wherein the evaluation of the at least two respective measurement results is performed in synchronism or phase-coherently with respect to each other.

13. The method according to claim 12, further comprising:
measuring at each of the at least two different points, the received power in a time maximally deviating 1% or 2% from real time.

14. The method according to claim 12, further comprising:
forming a planar array with the at least two different points, wherein the at least two different points are regularly spaced according to a specific pattern, or the at least two different points form any two-dimensional array, or a parabolic array or a spherical array or any three-dimensional array.

* * * * *